United States Patent [19]

Schweitzer, Jr.

[11] 4,063,171

[45] Dec. 13, 1977

[54] FAULT INDICATOR RESPONSIVE TO FLOW OF FAULT CURRENT IN A CONDUCTOR WHEN POWER FLOW IS IN ONE DIRECTION ONLY

[76] Inventor: Edmund O. Schweitzer, Jr., 1002 Dundee Road, Northbrook, Ill. 60118

[21] Appl. No.: 738,969

[22] Filed: Nov. 4, 1976

[51] Int. Cl.² .................... G01R 19/14; G01R 31/08; G01R 19/16
[52] U.S. Cl. .................................. 324/133; 324/52; 340/253 A
[58] Field of Search ............. 324/51, 127, 133, 52; 340/253 A

[56] References Cited

U.S. PATENT DOCUMENTS

| 2,808,566 | 10/1957 | Douma | 324/127 |
| 3,753,089 | 8/1973 | Gunn et al. | 324/133 X |
| 3,906,477 | 9/1975 | Schweitzer | 324/133 X |
| 3,986,115 | 10/1976 | Huang | 324/133 X |
| 3,986,116 | 10/1976 | Smith et al. | 324/133 X |

Primary Examiner—Gerard R. Strecker
Attorney, Agent, or Firm—Lockwood, Dewey, Zickert & Alex

[57] ABSTRACT

The occurrence of fault current flow in an alternating current carrying conductor is indicated if the power flow in the conductor is in one or a preferred direction and is not indicated if the power flow in the conductor is in the opposite direction.

8 Claims, 2 Drawing Figures

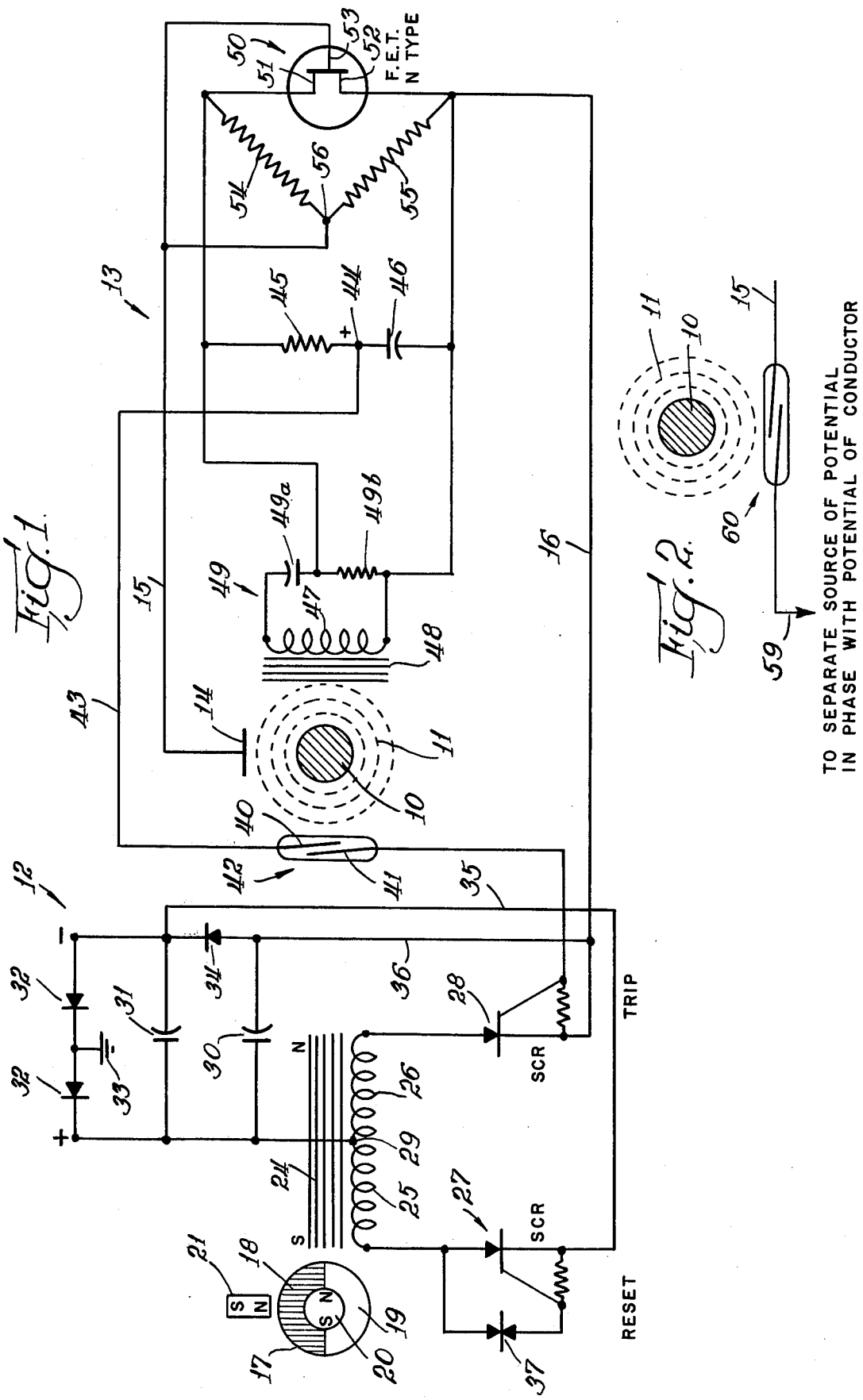

FAULT INDICATOR RESPONSIVE TO FLOW OF FAULT CURRENT IN A CONDUCTOR WHEN POWER FLOW IS IN ONE DIRECTION ONLY

This invention relates, generally, to fault indicators and it has particular relation to fault indicators that are responsive only to one direction of alternating current power flow. It constitutes an improvement over the devices disclosed in my U.S. Pat. Nos. 3,535,593 and 3,906,477, issued Oct. 20, 1970 and Sept. 16, 1975, respectively.

When the alternating current power flow in a conductor occurs, it is desirable that an indication be given in order to assist in locating the fault. However, if the conductor forms a part of a network system, in the event of a fault on the system, the power flow may be in the opposite direction and an indication of a fault may be given even though it is not desired unless such action is prevented.

Among the objects of this invention are: to provide for indicating the flow of alternating fault current in a conductor when the power flow in the conductor is in one or a preferred direction and not in the opposite direction; to employ a field effect transistor (F.E.T.) to determine the direction in which power flows in the conductor; and to prevent resetting of the fault indicator when a potential in phase with the potential of the conductor but separate therefrom supplies operating potential to the system.

In the drawing:

FIG. 1 shows diagrammatically a preferred embodiment of the invention;

FIG. 2 shows how a switch can be inserted in a conductor to a separate potential source to prevent resetting of the fault indicator until current flow is re-established in the conductor in which the fault occurred.

In FIG. 1 conductor 10 is arranged to be energized with alternating current such as 60 Hz, and at a potential of the order of 14 Kv. If the conductor 10 forms a part of a grid circuit and a fault occurs, power may flow in one or a preferred direction, in which case it is desirable that the occurrence of the fault should be detected. If the power flow due to the fault is in the opposite direction, it may be undesirable to indicate that the fault has occurred since to do so would give an erroneous indication of the location of the fault.

The magnetic field generated by flow of current in conductor 10 is indicated at 11. Associated with the conductor 10 is a fault indicator, shown generally at 12, and power flow direction responsive means, shown generally at 13. The potential of the conductor 10 is applied to a plate or test point 14 that is capacitively related thereto and is connected by a conductor 15 to the power flow direction responsive means 13. Conductor 16 interconnects the latter and the fault indicator 12.

The fault indicator 12 includes a pivoted target disc 17 that is shown in the tripped position indicating that a fault had occurred on conductor 10. The target disc 17 has a red section 18 and a white section 19 only one of which is visible at one time. A permanent magnet 20 is secured to the disc 17 and a stationary permanent magnet 21 acts to bias the disc 17 and magnet 20 to either of its two indicating positions.

The position of the target disc 17 is controlled by a magnetizable core 24 on which are wound series connected reset and trip windings 25 and 26. They are arranged to be individually energized by voltage sensitive switch means 27 and 28 when the latter are individually rendered conducting as described hereinafter. A center tap 29 between windings 25 and 26 is connected to capacitors 30 and 31 and to one pole of series connected rectifiers 32 that are commonly connected to ground at 33. The other pole of rectifier 32 is connected to the capacitors 30 and 31 with a blocking diode 34 connected between them to permit only capacitor 31 to discharge over conductor 35 for energizing reset winding 25 while both capacitors 30 and 31 are discharged over conductor 36 for energizing trip winding 26. Voltage sensitive switch means 27 is rendered conducting when trigger diode 37 breaks down on capacitor 31 being fully charged.

In response to flow of fault current in the conductor 10 contacts 40 and 41 of magnetic material in a reed switch 42 located in the magnetic field 11 close to complete a circuit from the voltage sensitive means 28 over conductor 43 to a common connection 44 between a resistor 45 and a capacitor 46 which are energized from a current responsive winding 47 on a core 48 located in the magnetic field 11 through a phase shift circuit 49 comprising a capacitor 49a in series with a resistor 49b. The common connection 44 will have applied thereto a positive potential only if the phase relation between the potential of and the current flow in conductor 10 corresponds to power flow in one or a preferred direction in the conductor 10. Voltage sensitive switch means 28 then is rendered conducting, trip winding 26 is energized and the target disc 17 is shifted to the tripped position to indicate that a fault has occurred on the conductor 10 incident to power flow in the preferred direction.

The polarity of the common connection 44 is controlled by a field effect transistor F.E.T. 50. Its source 51 and drain 52 are connected across the output of the phase shifting circuit 49 and its gate 53 is connected for potential energization to conductor 15. Bridge circuit resistors 54 and 55 are connected across drain 51 and source 52 with their common connection 56 connected to conductor 15.

As pointed out, only when the common connection 44 between resistor 45 and capacitor 46 is positive will the voltage sensitive switch means 28 be rendered conducting even though contacts 40 and 41 of the reed switch 42 are closed. This occurs only when the flow of power in the conductor 10 is in the preferred direction. If the power flow is in the opposite direction, as when there is a phase shift of 180° between the current flow in and the potential of the conductor 10, then the polarity of the common connection 44, under the control of the F.E.T. 50 is either negative or zero and voltage sensitive switch means 28 is not rendered conducting.

As indicated in FIG. 2, the conductor 15 may be energized from a source 59 of potential separate from the conductor 10 but in phase with it. In a grid system such a separate source is readily available and may remain available even though conductor 10 may be de-energized. If not interrupted, such separate source 59 may cause recharging of capacitor 31 to render the voltage sensitive switch means conducting resulting in operation of the target disc 17 to the reset position. This is not desired until the fault is found and removed and current again flows in conductor 10. To prevent such undesired operation a reed switch 60 is interposed in conductor 15 when it is connected as indicated in FIG. 2. The reed switch 60 is located in the magnetic field 11 around conductor 10 and its contacts are closed only when current flows in conductor 10.

I claim:

1. Means responsive to flow of alternating fault current in and high voltage energization of a conductor in which the power flow may be in a preferred direction or in the opposite direction depending upon the location of the fault comprising: a fault indicator including, a target, a magnetic core, a trip winding on said magnetic core for moving said target from a non-indicating position to a fault indicating position and voltage sensitive switch means connected to said trip winding for energizing it from a current source on application of predetermined control potential thereto; power flow direction responsive means energized in accordance with the voltage at which said conductor is energized and the current flow in said conductor arranged to generate said control potential when the power flow is in said preferred direction, and circuit means interconnecting said voltage sensitive switch means and said power flow direction responsive means including switch means responsive to flow of fault current in said conductor to render said voltage sensitive switch means conducting when said power flow is in said preferred direction to energize said trip winding.

2. Direction of power flow responsive means according to claim 1 wherein said power flow direction responsive means include: an F.E.T. with the gate energized in accordance with the potential of said conductor, and the source and drain energized in accordance with the current flow in said conductor.

3. Direction of power flow responsive means according to claim 2 wherein impedance means interconnect said source and drain with an intermediate point energized in accordance with said potential and series connected impedance and capacitance means shunt said source and drain, said circuit means being connected to the common connection between said impedance and capacitance means.

4. Direction of power flow responsive means according to claim 1 wherein a source for said high voltage is separate from and in phase with the potential of said conductor, and switch means responsive to current flow in said conductor complete a circuit from said source to said power flow direction responsive means only when current is flowing in said conductor.

5. Direction of power flow responsive means according to claim 4 wherein said means for completing said circuit includes normally open switch means arranged to be closed by the magnetic field generated by current flow in said conductor.

6. Direction of power flow responsive means according to claim 1 wherein said magnetic core has a reset winding thereon for moving said target from said fault indicating position to said non-indicating position, and said reset winding is energized from a potential corresponding to the potential of said conductor.

7. Direction of power flow responsive means according to claim 6 wherein said reset winding is energized from capacitance means arranged to be charged through rectifier means energized at a potential corresponding to that of said conductor.

8. Direction of power flow responsive means according to claim 7 wherein said potential is provided by a source separate from and in phase with the potential of said conductor.

* * * * *